(12) United States Patent
Wurth et al.

(10) Patent No.: US 7,648,387 B2
(45) Date of Patent: Jan. 19, 2010

(54) DIAGNOSTIC JUMPER

(75) Inventors: Steven P. Wurth, Sylvania, OH (US); Stephen W. Pratt, Lambertville, MI (US); Dan Zeitz, Hillsboro, MO (US)

(73) Assignee: Wurtec Elevator Products & Services, Toledo, OH (US)

( * ) Notice: Subject to any disclaimer, the term of this patent is extended or adjusted under 35 U.S.C. 154(b) by 0 days.

(21) Appl. No.: 12/266,599

(22) Filed: Nov. 7, 2008

(65) Prior Publication Data

US 2009/0121731 A1 May 14, 2009

Related U.S. Application Data

(60) Provisional application No. 61/002,421, filed on Nov. 8, 2007.

(51) Int. Cl.
*H02J 3/00* (2006.01)

(52) U.S. Cl. .................... 439/502; 307/141.4; 439/955

(58) Field of Classification Search ................ 439/502, 439/638, 955; 307/141, 141.4; 137/624.12; 324/754
See application file for complete search history.

(56) References Cited

U.S. PATENT DOCUMENTS

| | | | |
|---|---|---|---|
| 2,653,297 A | 9/1953 | Mohylowski | |
| 2,763,834 A | 9/1956 | MacDonald et al. | |
| 4,163,134 A | 7/1979 | Budrose | |
| 4,195,558 A * | 4/1980 | Speakman | 99/325 |
| 4,348,696 A * | 9/1982 | Beier | 725/29 |
| 4,414,506 A | 11/1983 | Kelley | |
| 4,484,220 A * | 11/1984 | Beetner | 348/730 |
| 4,964,807 A | 10/1990 | Draus | |
| 5,004,014 A * | 4/1991 | Bender | 137/624.12 |
| 5,230,637 A * | 7/1993 | Weber | 439/504 |
| 5,424,903 A * | 6/1995 | Schreiber | 361/166 |
| 5,588,682 A * | 12/1996 | Breese | 285/52 |
| 5,734,206 A * | 3/1998 | Keizer et al. | 307/116 |
| 6,329,616 B1 * | 12/2001 | Lee | 200/51.03 |
| 6,423,902 B1 | 7/2002 | Babiel et al. | |
| 6,476,523 B1 * | 11/2002 | Lee | 307/141 |
| 6,599,139 B1 * | 7/2003 | Hunter | 439/133 |
| 6,903,284 B2 * | 6/2005 | Dunfield et al. | 200/51 R |
| 7,231,262 B2 * | 6/2007 | Hollis et al. | 700/14 |
| 2004/0063464 A1 * | 4/2004 | Akram et al. | 455/559 |
| 2006/0196576 A1 * | 9/2006 | Fleming et al. | 141/198 |

* cited by examiner

*Primary Examiner*—Neil Abrams
(74) *Attorney, Agent, or Firm*—MacMillan, Sobanski & Todd, LLC (57) ABSTRACT

A jumper including a control module and a plurality of conduits connected to the control module is provided. A connector is connected to each of the conduits. The control module controls the flow of a communications medium through the conduits and the control module. The control module may be configured for activation by a user specific identification input.

19 Claims, 7 Drawing Sheets

DIAGNOSTIC JUMPER

RELATED APPLICATIONS

This application claims the benefit of U.S. Provisional Application No. 61/002,421, filed Nov. 8, 2007, the disclosure of which is incorporated herein by reference.

BACKGROUND OF THE INVENTION

This invention relates in general to a device for testing the operation of individual components or circuits in a control system. In particular, this invention relates to an improved structure for such a testing device that can be programmed to be functional for only a limited period of time.

Control systems are used to control a variety of structures, vehicles, and machinery, including elevators, automobiles, draw bridges, manufacturing assembly lines, printing presses, steel mills, telephone switch gear, and the like. Control systems can use a variety of mediums for communication between elements within the control system. For example, some control systems use electricity as the communication medium. Other control systems, such as for example pneumatic control systems, use air as the communication medium. Still other control systems, such as for example hydraulic control systems, use hydraulic fluid as the communication medium.

Regardless of the type, control systems typically include a variety of individual control components. The control components are often grouped into control circuits. As one example, electrical control systems include various individual components, such as for example relays, resistors, terminals, contacts, coils, solenoids, sensors, printed circuit boards, and switches.

Malfunctions can occur in control systems. The malfunctions can result from a variety of causes including failure of the individual components or a failure of a group of components. In the event of a malfunction in a control system, service personnel diagnose the problem in order to implement a timely repair. Malfunctions are often diagnosed by analyzing individual components or circuits. One technique for analyzing components or circuits involves temporarily removing the component or circuit from the control system. Another technique for analyzing components or circuits involves temporarily connecting components or circuits to the control system. Temporarily removing or connecting components or circuits to the control system can be accomplished by the use of jumpers.

Jumpers typically include a conduit configured to permit the flow of the communication medium and fasteners positioned at the ends of the conduit. In the example of an electrical jumper, the conduit is a wire configured to permit the flow of electricity as the communication medium between electrical connectors positioned at the ends of the wire. In the example of a pneumatic jumper, the conduit is a hose or pipe configured to permit the flow of air as the communication medium between hose or pipe fittings positioned at the ends of the hose or pipe.

At the completion of the analysis of the malfunction, the jumpers are removed from the control system. In the event the jumpers are not removed after the control system is placed back into regular operation, the jumpers can continue to affect the operation of the control system. It would be advantageous to provide an improved jumper that that can be programmed to be functional for only a limited period of time.

SUMMARY OF THE INVENTION

According to this invention, there is provided a jumper including a control module and a plurality of conduits connected to the control module. A connector is connected to each of the conduits. The control module controls the flow of a communications medium through the conduits and the control module.

According to this invention, there is also provided a method for controlling the flow of a communications medium in a control system. The method includes the steps of selecting a plurality of test points of the component or circuit to be analyzed and connecting a jumper to the selected plurality of test points. The jumper is programmed to include a time duration for controlling the flow of the communication medium through the jumper. The jumper is activated and the circuits or components are tested by controlling the flow of the communications medium through the jumper.

According to this invention, there is also provided a jumper adapted to control the flow of a communications medium between test points within a control system for a limited period of time. The jumper includes a control module configured to be programmable and a plurality of conduits connected to the control module. The conduits are adapted to contain the flow of the communications medium within the control system. A connector is connected to each of the conduits. The control module controls the flow of a communications medium through the conduits and the control module for a limited period of time.

Various advantages of this invention will become apparent to those skilled in the art from the following detailed description of the invention, when read in light of the accompanying drawings.

DETAILED DESCRIPTION OF THE INVENTION

Figure 1:
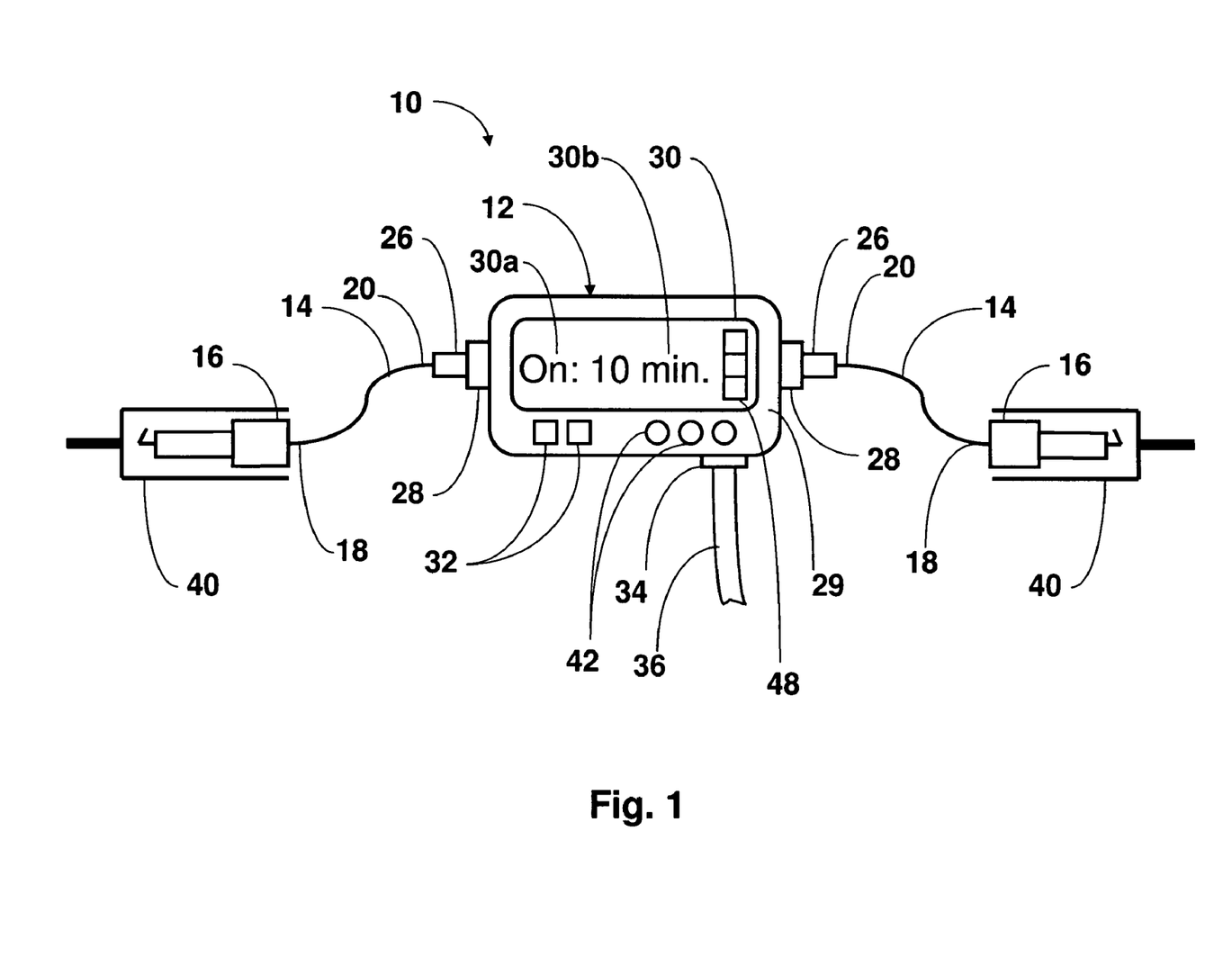
FIG. 1 is a front elevational view of a first embodiment of a diagnostic jumper in accordance with this invention.

Referring now to the drawings, there is illustrated in FIG. 1 a first embodiment of a diagnostic jumper 10 that can be programmed to be functional for only a limited period of time. Generally, the diagnostic jumper 10 includes a conduit configured to permit the flow of a communication medium and a switch. In operation, when the switch is in an opened position, the switch permits the flow of the communication medium through the conduit. When the switch is in a closed position, the switch prevents the flow of the communication medium through the conduit. The switch can be programmed to be in an opened or closed position for a limited period of time.

In the embodiment illustrated in FIG. 1, the diagnostic jumper 10 is configured for electrical control systems. As will be explained in more detail below, the diagnostic jumper 10 can be configured for other types of control systems, such as for example pneumatic or hydraulic control systems. The term "electrical" as used herein, is defined to include electric, electronic, and microprocessor based components, circuits and systems.

Referring again to FIG. 1, the diagnostic jumper 10 includes a control module 12, a pair of conduits 14, and a pair of connectors 16. The conduits 14 are configured to conduct the flow of electricity from one connector 16 through the control module 12 to the other connector 16. The conduits 14 may, for example, be made of twenty gauge, stranded copper wire. Alternatively, the conduits 14 can be made of other desired conductive materials such as, for example, aluminum and can be other desired wire sizes. The conduits 14 can also be made of solid wire. Each conduit 14 includes a connector end 18 and a control module end 20.

The connector end 18 of each conduit 14 is attached to one of the connectors 16. In the illustrated embodiment, the connector 16 is a spring-loaded mini-clip. However, the connector 16 can be other desired mechanisms or devices. Optionally, a probe 40 can be connected to one or each of the connectors 16 such that the probe 40 is electrically conductive with the connector 16. The conduits 14 and the connectors 16 are rated for electrical use over any desired electrical service range.

The control module end 20 of the conduit 14 is attached to the control module 12. In the illustrated embodiment, the control module end 20 includes a conduit plug 26 that cooperate with a corresponding conduit jack 28 provided on the control module 12. The use of the conduit plug 26 and the corresponding conduit jack 28 allows a temporary connection between each of the conduits 14 and the control module 12. The temporary connection allows conduits 14 having alternate connectors (not shown) to be easily connected to the control module 12. The control module end 20 of the conduit 14 can alternatively be connected to the control module 12 using other mechanisms or devices, such as for example screw-on terminals or wiring harnesses, or may be permanently connected thereto.

The control module 12 includes an enclosure 29 containing an optional display 30, at least one adjusting button 32, and an optional communication jack 34.

Figure 2:
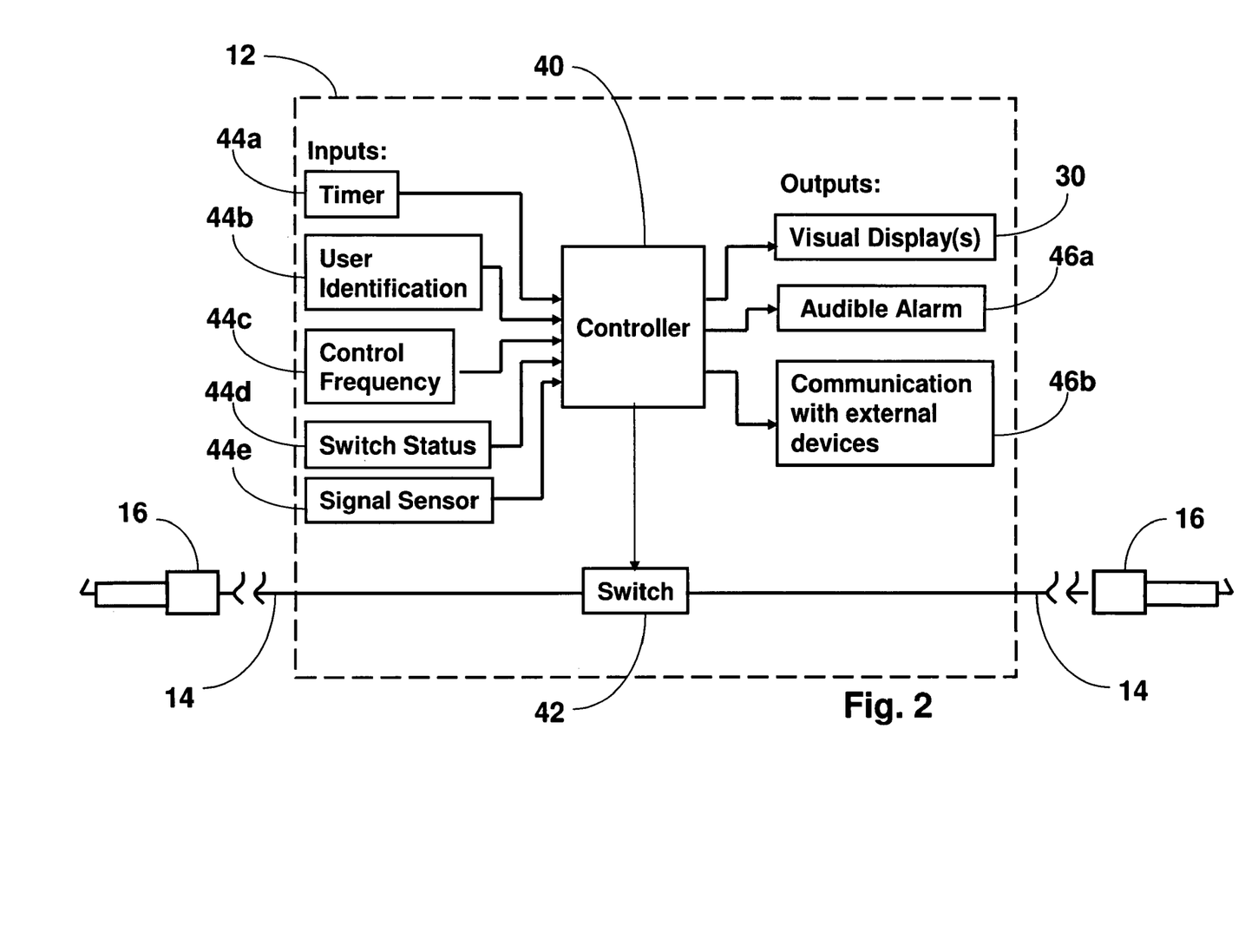
FIG. 2 is a block drawing of a control module of the diagnostic jumper of FIG. 1.

Referring now to FIG. 2, a block diagram of the control module 12 is illustrated. The control module 12 includes a controller 40, a switch 42, a plurality of inputs 44a-44e, and a plurality of outputs, 30, 46a, and 46b. The controller 40 is configured to receive the plurality of inputs 44a-44e, control the operation of the diagnostic jumper 10 through operation of the switch 42, and control the plurality of outputs, 30, 46a, and 46b. In the illustrated embodiment, the controller 40 is a microprocessor. However, the controller 40 can be any desired device sufficient to control the operation of the diagnostic jumper 10.

The switch 42 is controlled by the controller 40. In operation, when directed by the controller 40 to be in an opened position, the switch 42 permits the flow of the communication medium through the conduit 14. When directed by the controller 40 to be in a closed position, the switch 42 prevents the flow of the communication medium through the conduit 14. The controller 40 can be programmed to open or close the switch 42 for a limited period of time. The switch 42 can be embodied as any desired device.

The inputs 44a-44e provide information to the controller 10 that facilitate the operation of the diagnostic jumper 10. The first input, a timer input 44a, is configured to count the remaining time the switch 42 is to remain in an opened or closed position. In the illustrated embodiment, the timer input 44a counts down from a specified interval. However, the timer input 44a can operate in any desired manner. The timer input 44a provides the remaining time information to the controller 40. When the timer input 44a counts down to no time remaining, the controller 40 directs the switch 42 to open or close, thereby either permitting the flow of the communication medium through the conduits 14 or preventing the flow of the communication medium through the conduits 14. The timer input 44a can be any desired device.

The second input, a user identification input 44b, is configured to input the identification of a user thereby enabling the use of the diagnostic jumper 10. In the illustrated embodiment, the diagnostic jumper 10 is programmed to have user-specific security, that is only a permitted user can use the diagnostic jumper 10. The user-specific security can have any desired form, such as for example passwords, user codes, and the like. The user identification input 44b provides confirmation of the user identification to the controller 40 enabling the operation of the diagnostic jumper 10. However, configuring the diagnostic jumper 10 to include user-specific security is optional and not necessary for the operation for the diagnostic jumper 10.

The third input, a control frequency input 44c, is configured to set or identify the communication frequency of a remote external device for the purposes of remotely controlling the operation of the diagnostic jumper 10. In the illustrated embodiment, the diagnostic jumper 10 is programmed to be controlled by a remote device utilizing desired communication frequencies. The control frequency input 44c sets or identifies the programmed control frequency to the controller 40 enabling the remote operation of the diagnostic jumper 10. However, configuring the diagnostic jumper 10 to include the control frequency input 44c is optional and not necessary for the operation for the diagnostic jumper 10.

The fourth input, a switch status input 44d, is configured to monitor the opened or closed status of the switch 42 and communicate the status to the controller 40. The switch status input 44d can be any desired sensor and communication device.

The fifth input, a signal sensor input 44e, is configured to sense various characteristics or parameters of the communication medium flowing through the conduits 14 and the switch 42. In the illustrated embodiment, the signal sensor input 44e detects the type of electrical current, that is A.C. or D.C., flowing through conduits 14 and the switch 42. However, the signal sensor input 44e could also detect other characteristics of the communication medium flowing through the conduits 14 and the switch 42. For example, if the control system is a pneumatic control system and the communication medium is air, then the signal sensor input 44e, could sense air pressure. The signal sensor input 44e provides information concerning the characteristics or parameters of the communication medium to the controller 40 enabling the operation of the diagnostic jumper 10.

Referring now to FIGS. 1 and 2, the controller 40 provides information to the visual display 30. The display 30 is configured to display various information, such as for example, initial programming information and the status of the diagnostic jumper 10. In the illustrated embodiment, the display 30 is a commercially available LCD display. However, the display 30 can be a touch screen display or other type of display sufficient to display various information. The display 30 can have a high visibility illumination such as, for example, indiglo lights or high visibility backlighting sufficient to view the display 30 in a darkened room or low visibility conditions. However, it should be understood the display 30 is optional and the operation of the diagnostic jumper 10 may be practiced without the display.

Referring again to FIG. 1, the display 30 can indicate the operating status of the diagnostic jumper 10. The display 30 includes an on/off indicator 30a and a time duration indicator 30b. In the illustrated embodiment, the on/off indicator 30a displays information concerning the status of the diagnostic jumper 10 to permit the flow of the communication medium through the conduits 14 and through the switch 42. If the on/off indicator 30a is shown as "On," then the diagnostic jumper 10 permits the flow of the communication medium through the conduits 14 and through the switch 42. Conversely, if the on/off indicator 30a is shown as "Off," then the diagnostic jumper 10 prevents the flow of the communication medium through the conduits 14 and through the switch 42.

The time duration indicator 30b is configured to display the time remaining for the diagnostic jumper 10 to permit the flow of the communication medium through the conduits 14 and the switch 42. In the illustrated embodiment, the display on the time duration indicator 30b of "ten min" indicates the diagnostic jumper 10 will permit the flow of the communication medium for a time period of ten minutes. However, the time period can be any desired duration. The time duration indicator 30b can be programmed to display a continuously declining amount of time in any desired time increments. For example, the time duration indicator 30b can be programmed to display any declining time increments in seconds, minutes, hours and the like.

The display 30 can also show other information, such as for example, information concerning the communication medium, the user of the diagnostic jumper 10, and setup information. Examples of displayed information concerning the communication medium can include voltages, currents, polarities, pressures, and frequency. Examples of displayed information concerning the diagnostic jumper user can include user identification, user passwords, setup information, menus, remote control frequencies, or facility identification. Examples of setup information include remote control frequencies and timer count increments.

As shown in FIG. 1, the output of the controller 40 to a visual display can be in the form of a plurality of illuminated indicators 42. In the illustrated embodiment, the indicators 42 are configured to selectively illuminate upon the existence of pre-determined conditions. For example, the illuminated indicators 42 are different colors representing different operating conditions of the diagnostic jumper 10. An illuminated indicator displaying a green color indicates the diagnostic jumper 10 is permitting the flow of the communication medium through the conduits 14 and the switch 42, a red color indicates the diagnostic jumper 10 is preventing the flow of the communication medium through the conduits 14 and the switch 42 and a yellow color indicates the presence of an undesired communication medium parameter, such as for example, high current, high voltage, or high pressure. However, other colors representing other conditions may be used. In the illustrated embodiment, the illuminated indicators 42 are light-emitting diodes. However, the illuminated indicators 42 can be any other type of lights such as, for example, standard filament lights, krypton lights, halogen lights, neon lights, and the like.

Referring again to FIG. 2, the controller 40 can output to an audible alarm 46a. The audible alarm 46a can be sounded in the event of certain conditions. The audible alarm 46a can be any desired sound, such as for example, a beep, chirp, or buzzer or a series of beeps, chirps, or buzzers. The conditions under which the audible alarm 46a can be triggered by the controller 40 can include a wide range events such as, for example, the time remaining for the diagnostic jumper 10 to permit the flow of the communication medium through the conduits 14 and the switch 42, a periodic timer 44a countdown (e.g. every five minutes), or the presence of an undesired communication medium parameter, such as for example, high current, high voltage, or high pressure. It is contemplated that the control module 12 may include both the display 30 and the audible alarm 46a or that the control module 12 may include one of the display 30 or the audible alarm 46a. It should be understood the audible alarm 46a is optional and the operation of the diagnostic jumper 10 may be practiced without the audible alarm 46a.

As will be explained in more detail below, the controller 40 can also optionally communicate with external devices through the external communications output 46b.

Referring now to FIG. 1, the adjusting buttons 32 are configured to input various data and operating parameters such as, for example, user identification, timer duration, remote control frequencies, and facility identification. The adjusting buttons 32 can be of any type of commonly available module button. While two adjusting buttons 32 are illustrated, it should be appreciated that more or less than two adjusting buttons 32 can be used. It is also contemplated that the control module 12 does not include adjusting buttons 32. Accordingly, data and operating parameters may be input into the control module 12 without the use of adjusting buttons 32.

The communications jack 34 is configured to allow a connection between the external communications output 46b of the control module 12 and an external communications device (not shown). The external communications device is connected to the communications jack 34 through a communications wire 36. In the illustrated embodiment, the communication jack 34 is a mini-USB jack. However, the communication jack 34 can be other desired jacks, such as for example, an RJ11 telephone jack, or a PS/2 computer port. While the embodiment shown in FIG. 1 illustrates one communication jack 34, it should be appreciated that more than one communications jack 34 can be used. It is also contemplated that the diagnostic jumper 10 can be practiced without a communications jack 34. Additionally, the external communications output 46b of the control module 12 can be configured to communicate with an external communications device via suitable wireless technology such as for example, RFID, Bluetooth, WiFi, and Zigbe. The external communications device can be configured to perform several functions, such as for example, programming operating parameters into the control module 12, charging an internal power source, and recording output data.

Referring now to FIG. 2, the control module 12 is powered by an internal power source (not shown). The internal power source has sufficient power to allow for sustained operation of the control module 12 for a selected period of time. In the illustrated embodiment, the selected period of time is approximately ninety days. However, the selected period of time can be more or less than ninety days. In the illustrated embodiment, the internal power source is a battery. However, the internal power source can be other desired sources of power such as, for example, a solar cell. The power source is configured to be recharged by any desired method, including such as for example, by the external communications device, by automobile charger, or by a stand alone battery.

Alternatively, the control module 12 can be powered from external power sources (not shown). Examples of external power sources include external batteries and facility main line power. In another embodiment, the control module 12 can derive operating power from the power contained in the component or circuit under analysis. In this embodiment, the control module 12 can utilize the communication medium within the connected or disconnected circuit for internal power. Optionally, the display 30 can include an internal power indicator 48. The internal power indicator 48 can be configured to display the remaining power of the internal power source. Alternatively, the internal power indicator 48 can be configured to display the power consumed from the circuit being analyzed. In the illustrated embodiment, the internal power indicator 48 is a vertical segment indicator. However, the internal power indicator 48 can have any desired display format.

Figure 3:
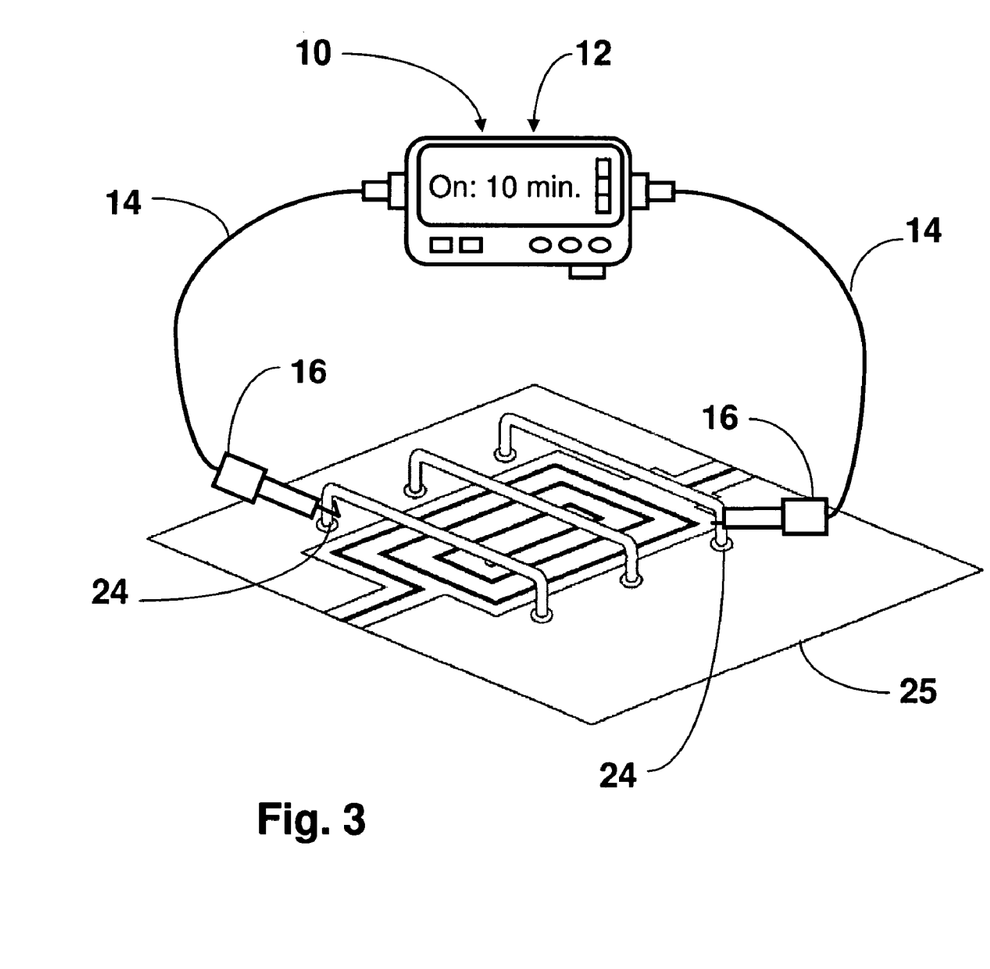
FIG. 3 is a perspective view of the diagnostic jumper of FIG. 1 connected to test points of a printed circuit board.

As shown in FIG. 3, the diagnostic jumper 10 can be used to analyze an electrical circuit within a printed circuit board 25. In this embodiment, each connector 16 is attached to a test point 24. The test points 24 represent various locations within an electric circuit. The term test point, as used herein, is defined to mean any location in a circuit or any portion of a component having a measurable parameter of the communication medium, such as for example pressure, current, voltage, or frequency. Examples of the test points 24 can include locations on the printed circuit board 25, locations within a pneumatic control system, locations within specific components or locations that span specific components or circuits.

In operation, a user programs the diagnostic jumper 10 using the adjusting buttons 32 or an external communications device. The user inputs the time for the diagnostic jumper 10 to permit the flow of the communication medium through the conduits 14 and the switch 42. The user can input any desired time period. Alternatively, the diagnostic jumper 10 can be pre-programmed to limit the time period selected by the user. At this point, the on/off indicator 30a displays "On" and the time duration indicator 30b displays the selected duration time. The user selects the specific test points for the components and/or circuits to be analyzed. The user connects one of the connectors 16 to the first test point and the remaining connector 16 to a second test point. The analysis of the selected circuit or component is completed as desired. Upon completion of the analysis, the user removes the diagnostic jumper 10 from the test points 24 and disables the diagnostic jumper 10 by using the adjusting buttons 32 or the external communications device. Alternatively, in the event the user does not remove the diagnostic jumper 10 from the test points 24, the diagnostic jumper 10 will automatically become disabled when the user selected duration time expires.

As described above, the control module 12 can be programmed to include information including, for example, user identification, user passwords, setup information, menus, remote control frequencies, or facility identification. It is contemplated that the diagnostic jumper 10 can be programmed to be user specific and/or facility specific. In the event the diagnostic jumper 10 is programmed to be user specific, a user is required to use secure identification to activate and use the diagnostic jumper 10. In one embodiment, the secure identification can be user or employee numbers, social security numbers, or passwords. In another embodiment, the secure identification can be other methods of limiting the use of the diagnostic jumper 10 to an authorized user such as, for example, bar codes. In a similar manner, the use of the diagnostic jumper 10 can be limited to specific facilities or specific control equipment within a facility.

Figure 4:
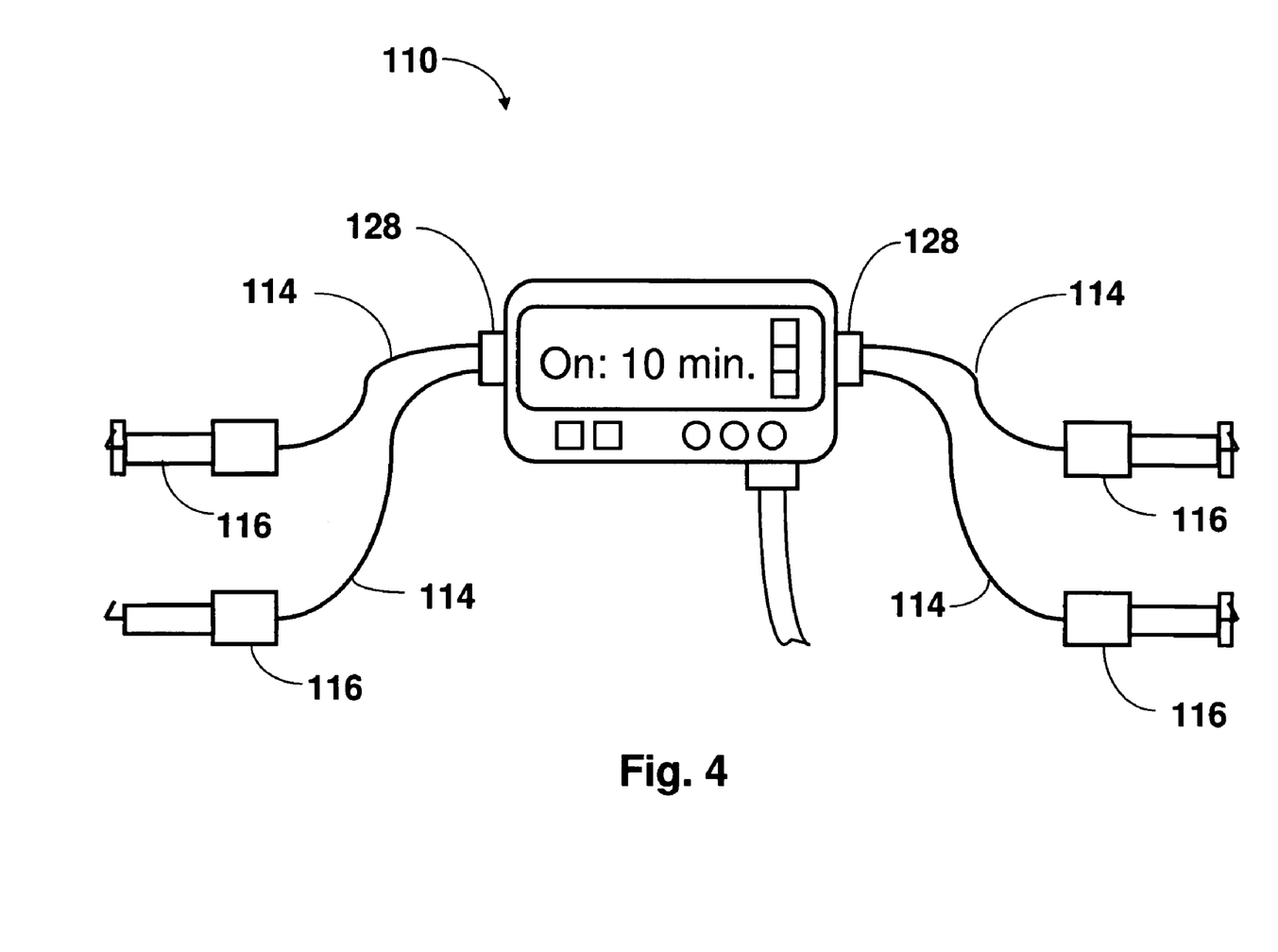
FIG. 4 is a front elevational view of a second embodiment of a diagnostic jumper in accordance with this invention.

A second embodiment of the diagnostic jumper 110 is illustrated in FIG. 4. In this embodiment, each conduit jack 128 is connected to more than one conduit 114. While FIG. 4 illustrates two conduits 114 connected to each conduit jack 128, it should be understood that more than two conduits 114 can be connected to each conduit jack 128. Each conduit 114 is connected to a connector 116. The use of multiple conduits 114 allows the diagnostic jumper 110 to diagnose a larger number of control components and/or control circuits. In this embodiment, the diagnostic jumper 110 is programmed as described above such that the analysis of each control component and/or control circuit is enabled with its own duration time.

Figure 5:
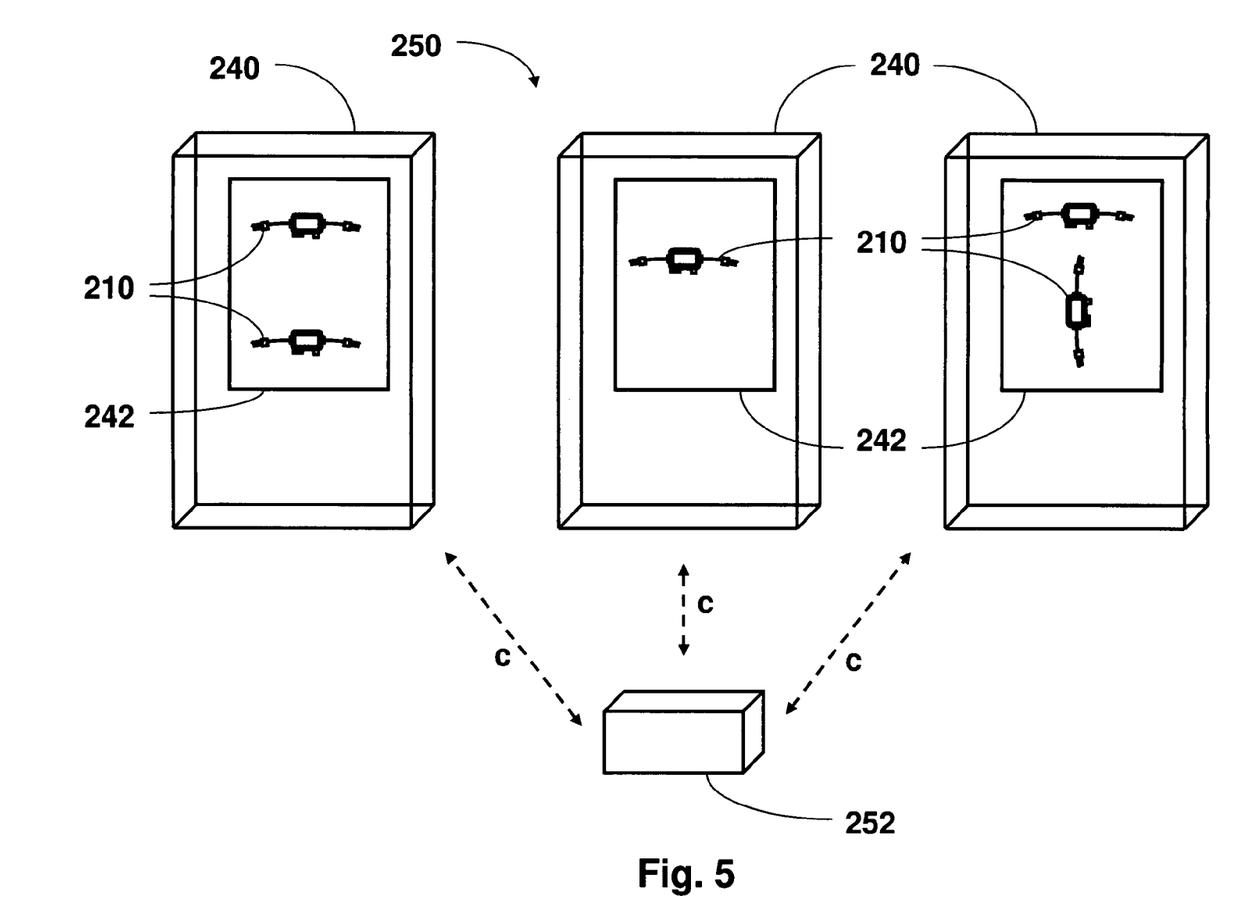
FIG. 5 is a front elevational view of a third embodiment of a diagnostic jumper in accordance with this invention.

A third embodiment of the diagnostic jumper 210 is shown in FIG. 5. In this embodiment, a plurality of diagnostic jumpers 210, positioned in a facility 250, can be controlled by a user in a location remote. The facility 250 can be any building, structure, or location having control components or control circuits. As shown in FIG. 5, the facility 250 includes at least one cabinet 240. Each of the cabinets 240 contains at least one panel 242 having electric control components and control circuits. While the facility 250 shown in FIG. 5 includes three cabinets 240, each having one control panel 242, is should be understood that a facility can contain any number of cabinets 240, each having more than one control panel 242. As described above, the control panels 242 have been equipped with the diagnostic jumpers 210 for purposes of analyzing electric control components or control circuits. The facility 250 also includes a transceiver 252. The transceiver 252 is configured to receive signals from a remote source (not shown) and communicate with each of the diagnostic jumpers 210. Upon receiving a signal from the remote source, the transceiver 252 communicates selectively with each of the diagnostic jumpers 210. The transceiver 252 can communicate a variety of messages to control the operation of the diagnostic jumpers 210. For example, the transceiver 252 can communicate programming setup commands or commands used to enable or disable the operation of the diagnostic jumper 210. For purposes of clarity, the communication between the transceiver 252 and the diagnostic jumpers 210 is identified by the arrows "c". In the illustrated embodiment, the communication between the transceiver 252 and each of the diagnostic jumpers 210 occurs simultaneously. However, the communication between the transceiver 252 and each of the diagnostic jumpers 210 can occur sequentially or selectively. In the illustrated embodiment, the signals received by the transceiver 252 are transmitted by the user over a wireless communication system. Alternatively, the signals received by the transceiver 252 can be sent over other desired devices or systems such as, for example, telephone lines, internet lines, or other desired signaling systems.

As described above, the diagnostic jumper 10 can be configured for any desired control system having any type of communication medium. Examples of other types of control systems include pressurized pneumatic control systems, vacuum-based pneumatic control systems, hydraulic control systems, and control systems based on other desired signal types such as for example optical signals, electromagnetic waves such as radio waves or microwaves, and the like.

Figure 6:
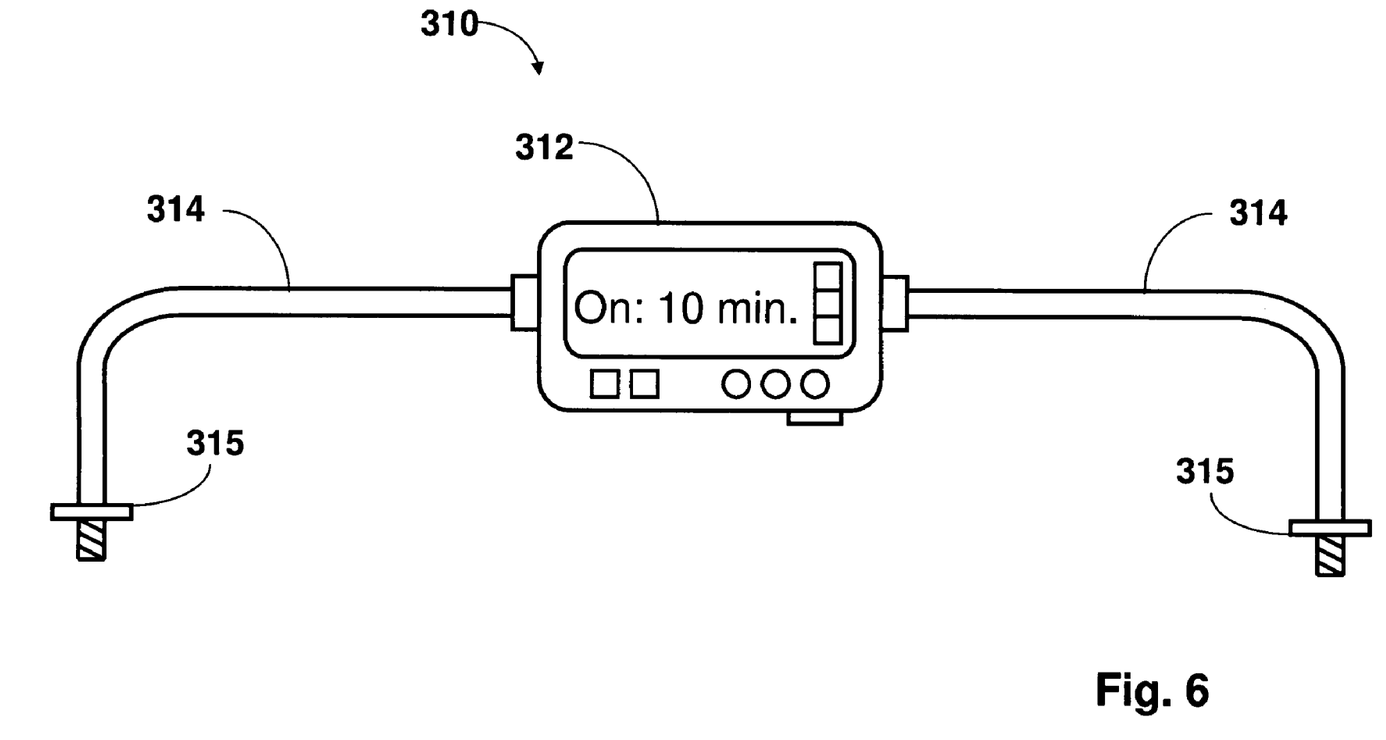
FIG. 6 is a front elevational view of a fourth embodiment of a diagnostic jumper in accordance with this invention.

Referring now to FIG. 6, a fourth embodiment of the diagnostic jumper 310 is illustrated. The diagnostic jumper 310 is configured for use in a fluid control system. The term "fluid control system" as used herein, is defined to mean any control system utilizing a fluid, such as for example air, oil, or water as the communication medium.

The diagnostic jumper 310 includes a control module 312 and a plurality of conduits 314 connected to the control module 312. The control module 312 is similar in operation as the control module 12 shown in FIG. 1. Each conduit 314 is configured to permit the flow of fluid as the communication medium. In the illustrated embodiment, the conduits 314 are made of hoses. However, the conduits 314 can be made of other desired materials, such as for example pipes. Each conduit 314 includes a fitting 315 configured to connect to a test point within the fluid control system. Each of the fittings 315 is configured to permit the flow of fluid through the fitting to the conduit 314. In the illustrated embodiment, the fittings 315 are threaded members. However, the fittings 315 can have any desired configuration sufficient to connect to a test point within the fluid control system.

Figure 7:
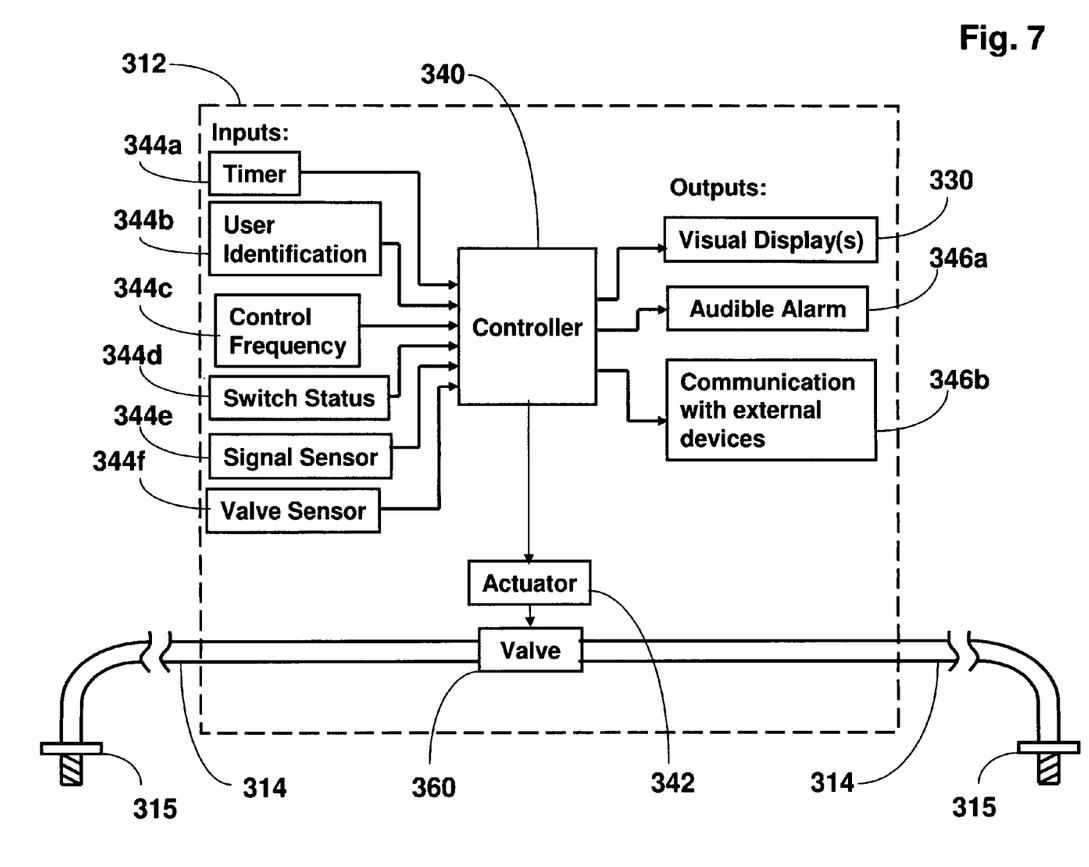
FIG. 7 is a block drawing of a control module of the diagnostic jumper of FIG. 6.

Referring now to FIG. 7, a block diagram of the control module 312 is illustrated. The control module 312 includes a controller 340, an actuator 342, a plurality of inputs 344a-344f, a plurality of outputs, 330, 346a, and 346b and a valve 360. The controller 340, inputs 344a-344e, and outputs 330, 346a, and 346b function in the same manner as the controller 40, inputs 44a-44e, and outputs 30, 46a, and 46b illustrated in FIG. 2. The actuator 342 is configured to receive commands from the controller and control the valve 360 in reaction to the commands. The actuator 342 can be any desired device. The valve 360 is configured to either permit or prevent the flow of the communication medium through the valve 360. The valve 360 can be any desired device.

The control module 312 includes a valve sensor input 344f configured to monitor the opened or closed status of the valve 360 and communicate the status to the controller 340. The valve status input 344f can be any desired sensor and communication device.

In operation, the diagnostic jumper 310 is programmed and enabled as described above. The user selects the specific test points for the components and/or circuits to be analyzed. The user connects one of the fittings 315 to the first test point and the remaining fitting 315 to a second test point. When directed by the controller 340, the actuator 342 opens the valve 360 thereby permitting the flow of the communication medium through the conduits 314. When the valve 360 is in a closed position, the valve 360 prevents the flow of the communication medium through the conduits 314. The analysis of the selected circuit or component is completed as desired. Upon completion of the analysis, the user removes the diagnostic jumper 310 from the test points and disables the diagnostic jumper 310 by using adjusting buttons or the external communications device. Alternatively, in the event the user does not remove the diagnostic jumper 310 from the test points 324, the diagnostic jumper 310 will automatically become disabled when the user selected duration time expires.

The principle and mode of operation of this invention have been described in its preferred embodiments. However, it should be noted that this invention may be practiced otherwise than as specifically illustrated and described without departing from its scope.

What is claimed is:

1. An electrical jumper comprising:
a control module, the control module configured for activation by a user specific identification input;
a pair of electrically conductive conduits connected to the control module; and
electrically conductive connectors connected to the pair of electrically conductive conduits, the electrically conductive connectors configured for electrically conductive attachment to test points in an electric circuit;
wherein the control module controls the flow of a communication medium through the electrically conductive conduits and the control module.

2. The jumper of claim 1, wherein the control module selectively enables or disables the jumper.

3. The jumper of claim 1, wherein the control module includes a controller.

4. The jumper of claim 3, wherein the controller controls a switch.

5. The jumper of claim 4, wherein the controller is configured to receive input from a timer input configured to count the remaining time the switch is to remain in an opened or a closed position.

6. The jumper of claim 3, wherein the controller is configured to receive input from a control frequency input configured to set or identify the communication frequency of a remote external device for the purposes of remotely controlling the operation of the jumper.

7. The jumper of claim 4, wherein the controller is configured to receive input from a switch status input configured to monitor the opened or closed status of the switch and communicate the status to the controller.

8. The jumper of claim 3, wherein the controller is configured to receive input from a signal sensor input configured to sense various characteristics or parameters of the communication medium.

9. The jumper of claim 1, wherein the control module communicates with external devices.

10. The jumper of claim 1, wherein the control module includes a display.

11. The jumper of claim 10, wherein the display displays the operating status of the jumper.

12. The jumper of claim 10, wherein the display displays the time remaining for the jumper to permit the flow of the communication medium.

13. The jumper of claim 1, wherein the control module includes a plurality of adjusting buttons.

14. The jumper of claim 1, wherein the control module is programmed by external devices.

15. The method of claim 14, wherein the jumper communicates with the external devices.

16. A method for controlling the flow of a communication medium in an electrical control system, the method comprising the steps of:
selecting a plurality of electrical test points of the component or electrical circuit to be analyzed;
connecting an electrical jumper to the selected plurality of electrical test points;
programming the electrical jumper to include a time duration for controlling the flow of the communications medium through the jumper, the programming of the electrical jumper configured for activation by a user specific identification input;
activating the jumper; and
testing the electrical circuits or components by controlling the flow of the communications medium through the electrical jumper.

17. An electrical jumper adapted to control the flow of a communications medium between tests points within an electric control system for a limited period of time, the electrical jumper comprising:

a control module, the control module configured to be programmable and further configured for activation by a user specific identification input;

a plurality of pairs of electrically conductive conduits connected to the control module, the conduits adapted to contain the flow of the communications medium within the control system; and a connector connected to each of the conduits, the connectors configured for electrically conductive attachment to test points within the electrical control system;

wherein the control module controls the flow of a communications medium through the pairs of conduits such that each pair of conduits is enabled with its own duration time.

18. The jumper of claim 17, wherein the controller is configured to receive input from a timer input configured to count the remaining time a switch is to remain in an opened or a closed position.

19. The jumper of claim 17, wherein the communications medium is air.

* * * * *